(12) United States Patent
Leschkies et al.

(10) Patent No.: US 10,062,561 B2
(45) Date of Patent: Aug. 28, 2018

(54) HIGH-PRESSURE ANNEALING AND REDUCING WET ETCH RATES

(71) Applicant: Applied Materials, Inc., Santa Clara, CA (US)

(72) Inventors: Kurtis S Leschkies, San Jose, CA (US); Keith Tatseun Wong, Mountain View, CA (US); Steven Verhaverbeke, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/360,016

(22) Filed: Nov. 23, 2016

(65) Prior Publication Data
US 2018/0122630 A1    May 3, 2018

Related U.S. Application Data

(60) Provisional application No. 62/415,757, filed on Nov. 1, 2016.

(51) Int. Cl.
*H01L 21/31*    (2006.01)
*H01L 21/02*    (2006.01)

(52) U.S. Cl.
CPC .. *H01L 21/02203* (2013.01); *H01L 21/02337* (2013.01)

(58) Field of Classification Search
None
See application file for complete search history.

(56) References Cited

U.S. PATENT DOCUMENTS

| 2007/0212850 A1* | 9/2007 | Ingle | C23C 16/045 438/435 |
| 2009/0104755 A1* | 4/2009 | Mallick | C23C 16/345 438/477 |
| 2014/0302688 A1 | 10/2014 | Underwood et al. | |
| 2014/0329027 A1 | 11/2014 | Liang et al. | |
| 2015/0044882 A1 | 2/2015 | Draeger et al. | |

(Continued)

FOREIGN PATENT DOCUMENTS

JP    2016-510507 A    4/2016

OTHER PUBLICATIONS

Tapan K Gupta "Copper Interconnect Technology" Springer Science 2009.*

(Continued)

*Primary Examiner* — Bradley K Smith
(74) *Attorney, Agent, or Firm* — Kilpatrick Townsend & Stockton LLP

(57) ABSTRACT

Methods are described for reducing the wet etch rate of dielectric films formed on a patterned substrate by flowing the material into gaps during deposition. Films deposited in this manner may initially exhibit elevated wet etch rates. The dielectric films are treated by exposing the patterned substrate to a high pressure of water vapor in the gas phase. The treatment may reduce the wet etch rate of the dielectric films, especially the gapfill portion of the dielectric film. Scanning electron microscopy has confirmed that the quantity and/or size of pores is reduced or eliminated by the procedures described herein. The treatment has also been found to reduce the etch rate, e.g., at the bottom of gaps filled with the dielectric film.

17 Claims, 9 Drawing Sheets

(56) References Cited

U.S. PATENT DOCUMENTS

| | | |
|---|---|---|
| 2015/0118862 A1 | 4/2015 | Reilly et al. |
| 2015/0118863 A1 | 4/2015 | Rathod et al. |
| 2016/0020089 A1 | 1/2016 | Thadani et al. |
| 2016/0056071 A1 | 2/2016 | Draeger et al. |
| 2016/0093488 A1 | 3/2016 | Thadani et al. |

OTHER PUBLICATIONS

International Search Report and Written Opinion of PCT/US2017/057911 dated Feb. 27, 2018, all pages.

* cited by examiner

HIGH-PRESSURE ANNEALING AND REDUCING WET ETCH RATES

CROSS-REFERENCES TO RELATED APPLICATIONS

This application claims the benefit of U.S. Provisional Patent Application No. 62/415,757, filed Nov. 1, 2016 entitled "HIGH-PRESSURE ANNEALING AND REDUCING WET ETCH RATES". The disclosure of 62/415,757 is hereby incorporated by reference in its entirety for all purposes.

FIELD

Embodiments disclosed herein relate to lowering the wet etch rate of gap-filling flowable films.

BACKGROUND

The miniaturization of semiconductor circuit elements has reached a point where feature sizes of about 10 nm are fabricated on a commercial scale. As the dimensions continue to get smaller, new challenges arise for process steps like filling a gap between circuit elements with a dielectric material that avoids electrical cross-talk. As the width between the elements continues to shrink, the gap between them often gets taller and narrower, making the gap difficult to fill without the dielectric material getting stuck to create voids or weak seams. Conventional chemical vapor deposition (CVD) techniques often experience an overgrowth of material at the top of the gap before it has been completely filled. This can create a void or seam in the gap where the depositing dielectric material has been prematurely cut off by the overgrowth; a problem sometimes referred to as breadloafing.

One solution to the breadloafing problem has been to use liquid precursors for the dielectric starting materials that more easily flow into the gaps. A technique currently in commercial use for doing this is called spin-on-glass (SOG). More recently, techniques have been developed that impart flowable characteristics to dielectric materials deposited by CVD. These techniques can deposit flowable precursors to fill a tall, narrow gap with porous material while reducing an incidence of creating voids or weak seams. While the new flowable CVD techniques represent a significant breakthrough in filling tall, narrow (i.e., high-aspect ratio) gaps with porous materials (such as low-k dielectric materials), there is still a need to increase the density of the gapfill material following deposition.

SUMMARY

Methods are described for reducing the wet etch rate of porous films formed on a patterned substrate by flowing the material into gaps during deposition. The film may be deposited by flowable chemical vapor deposition where precursors react on the patterned substrate from the gas phase or may be deposited from the liquid phase (e.g. spin-on glass (SOG) or spin-on dielectric (SOD)). The porous film may be a silicon-and-hydrogen-containing layer which further contains at least one of carbon, oxygen and nitrogen. Shortly after deposition, the porous film is treated by exposing the patterned substrate to a high pressure of water vapor in the gas phase. The porous film may or may not be cured prior to exposing the patterned substrate to the high pressure of water vapor. The treatment may reduce the wet etch rate of the porous films, especially the portion of the porous film inside trenches and gaps (the "gapfill" portion of the porous film). Scanning electron microscopy has confirmed that the quantity or size of pores is reduced or eliminated by the procedures described herein. The treatment has also been found to reduce the etch rate, e.g., at the bottom of gaps filled with the dielectric film.

Embodiments described herein include methods of processing a gapfill dielectric on a patterned substrate. The methods include forming a gapfill dielectric in a gap on the patterned substrate. The gapfill dielectric includes pores but otherwise fills the gap on the patterned substrate. The methods further include placing the patterned substrate into a substrate processing region of a substrate processing chamber. The methods further include densifying the gapfill dielectric by exposing the gapfill dielectric to gas-phase $H_2O$ at a partial pressure greater than 14.7 psi to form densified gapfill dielectric.

The gapfill dielectric may include silicon and hydrogen. The methods may further include exposing the gapfill dielectric to UV-light prior to densifying the gapfill dielectric. The methods may further include exposing the gapfill dielectric to ozone prior to densifying the gapfill dielectric. The methods may further include etching the gapfill dielectric with HF or a buffered oxide etching solution. A temperature of the patterned substrate may be between 300° C. and 700° C. during the densifying of the gapfill dielectric. A lowest temperature of an exposed surface within the substrate processing region may be greater than 220° C. The methods may further include removing the patterned substrate from the substrate processing region after densifying the gapfill dielectric. Forming the gapfill dielectric may include flowing material into the gap after the gapfill dielectric is initial deposited elsewhere on the patterned substrate. Forming the gapfill dielectric may include flowing material onto the patterned substrate from a liquid phase precursor. Forming the gapfill dielectric may include flowing material onto the patterned substrate from gas-phase precursors. The gapfill dielectric may contain no elements other than silicon, carbon, nitrogen, hydrogen and oxygen after forming the gapfill dielectric.

Embodiments described herein include methods of filling a trench in a patterned substrate. The methods include forming a dielectric film on the patterned substrate. Forming the dielectric film includes flowing dielectric material into the trench after initial deposition elsewhere onto the patterned substrate. The methods further include placing the patterned substrate into a substrate processing region of a substrate processing chamber. The methods further include densifying the dielectric material in the trench by exposing the dielectric material to gas-phase $H_2O$ at a partial pressure of $H_2O$ within the substrate processing region to form densified gapfill dielectric.

A temperature of a coldest surface exposed within the substrate processing region may be between 180° C. and 275° C. The partial pressure of $H_2O$ within the substrate processing region may be between 145 psi and 864 psi. A process pressure (in psi) may be below $(14.7/760)*10^{(a-b/(T+c))}$ where $a=7.96681$, $b=1668.21$, $c=228$ and T is the lowest temperature of any exposed surface within the substrate processing region. T may be between 100° C. and 374° C. No condensation may be formed within the substrate processing region while densifying the dielectric material in embodiments. No liquid $H_2O$ may be formed in the substrate processing chamber while exposing the dielectric material to gas-phase $H_2O$ according to embodiments. The trench may be part of a dense trench array.

Additional embodiments and features are set forth in part in the description that follows, and in part will become apparent to those skilled in the art upon examination of the specification or may be learned by the practice of the embodiments. The features and advantages of the embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Methods are described for reducing the wet etch rate of porous films formed on a patterned substrate by flowing the material into gaps during deposition. The film may be deposited by flowable chemical vapor deposition where precursors react on the patterned substrate from the gas phase or may be deposited from the liquid phase (e.g. spin-on glass (SOG) or spin-on dielectric (SOD)). The porous film may be a silicon-and-hydrogen-containing layer which further contains at least one of carbon, oxygen and nitrogen. Shortly after deposition, the porous film is treated by exposing the patterned substrate to a high pressure of water vapor in the gas phase. The porous film may or may not be cured prior to exposing the patterned substrate to the high pressure of water vapor. The treatment may reduce the wet etch rate of the porous films, especially the portion of the porous film inside trenches and gaps (the "gapfill" portion of the porous film). Scanning electron microscopy has confirmed that the quantity or size of pores is reduced or eliminated by the procedures described herein. The treatment has also been found to reduce the etch rate, e.g., at the bottom of gaps filled with the dielectric film.

Figure 1A:
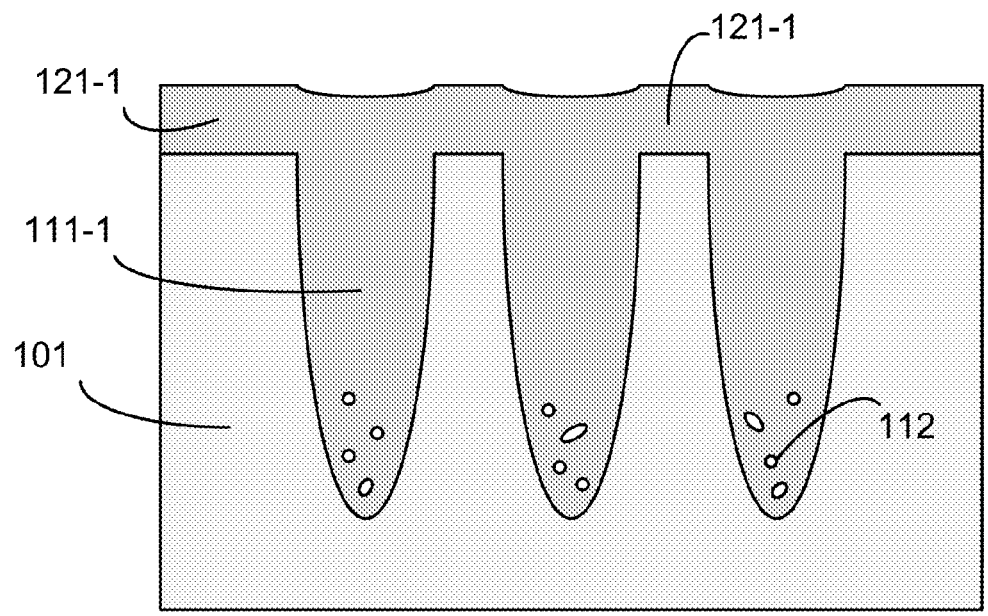
FIG. 1A is a side-view diagram illustrating gapfill dielectric prior to treatments according to embodiments.

Dielectric films may be flowably formed to fill gaps and trenches of patterned substrate with low-k dielectric material. The dielectric material may flow into the gaps and trenches during formation of the dielectric film. FIG. 1A is a side-view diagram illustrating gapfill dielectric 111-1 and overburden dielectric 121-1 following formation of the dielectric film on patterned substrate 101 according to embodiments. FIG. 1A depicts gapfill dielectric 111-1 and overburden dielectric 121-1 prior to the treatments described herein. Pores 112 may exist within gapfill dielectric 111-1 prior to the treatments described herein. Pores 112 may results in a much higher etch rate and wet etch rate of gapfill dielectric 111-1. Gapfill dielectric 111-1 may etch at a much higher rate than overburden dielectric 121-1 which may be undesirable, for example, in cases where gapfill dielectric 111-1 is to be reproducibly recessed. A benefit of the treatments described herein is a much lower (and more controllable) wet etch rate of gapfill dielectric 111-1.

Porous films may be formed by a variety of methods including flowable deposition techniques. Flowable deposition methods may be helpful by enabling the porous films to penetrate into gaps in patterned substrate 101. Dielectric films which flow during formation may exhibit wet etch rates (WERs) in aqueous, dilute (100:1) HF solutions in excess of 75 nm/minute in gapfill portions (gapfill dielectric 111-1 in FIG. 1A). For comparison, thermally formed silicon oxide possesses the lowest wet etch rate for commonly used silicon oxide and exhibits a wet etch rate of about 3 nm/minute. Conventional methods for reducing the wet etch rate of flowably deposited gapfill dielectric 111-1 include UV light treatments, ozone treatments and exposure to $H_2O$ at various pressures less than or about 1 atmosphere ($\leq$760 Torr, $\leq$14.7 psi). UV light treatments and ozone treatments may reduce the wet etch rate of gapfill dielectric 111-1 to between 50 nm/minute and 75 nm/minute. Conventional steam anneals involve exposure to $H_2O$ at sub-atmospheric pressures while the substrate temperature is elevated to ~500° C. and have been found to further reduce the wet etch rate of gapfill dielectric 111-1 to between 15 and 33 nm/minute.

Figure 1B:
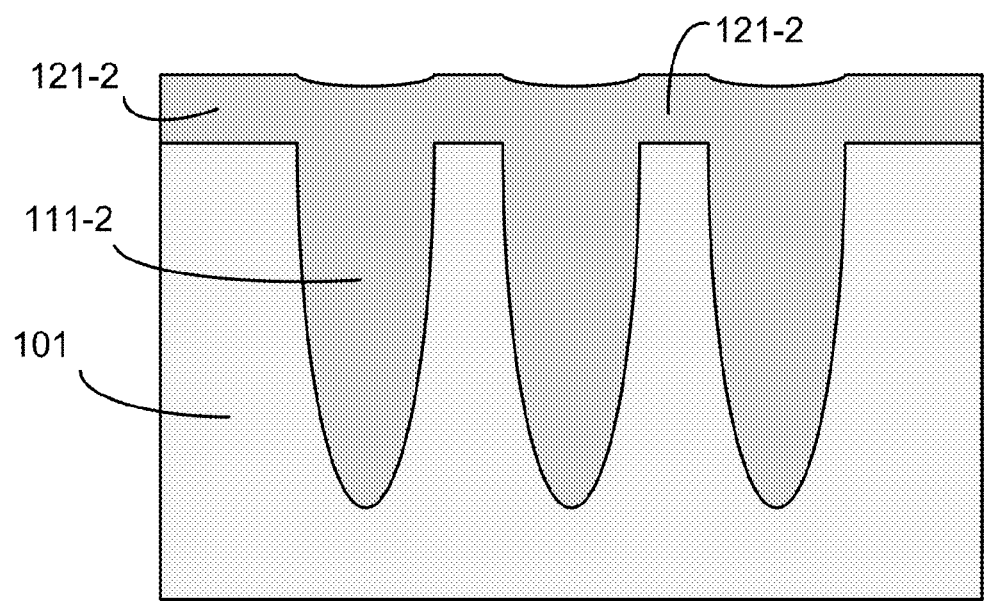
FIG. 1B is a side-view diagram illustrating gapfill dielectric after treatments according to embodiments.

FIG. 1B is a side-view diagram illustrating gapfill dielectric after treatments according to embodiments. A desirable wet etch rate to enable successful process integration into many process flows is below or about twice the wet etch rate of thermal silicon oxide. In other words, a benefit of the treatments described herein is the formation of gapfill dielectric 111-2 which incurs less than or about twice the wet etch rate of thermal silicon oxide. The wet etch rate of thermal silicon oxide in a variety of HF solutions (e.g. a buffered oxide etching solution) may be less than 4 nm/minute. The treatments described herein may produce gapfill dielectric 111-2 which are etched at less than 8 nm/minute in HF solutions. The treatments described herein may be densifying gapfill dielectric 111-1 to remove pores 112 and form gapfill dielectric 111-2 (shown without pores 112 in FIG. 1B). Dense trench arrays such as those filled by gapfill dielectric 111-1 are densified to a greater degree than sparser trenches and isolated dielectric regions of patterned substrate 101. The data described herein will apply to dense trench arrays since a low wet etch rate for dense area gapfill dielectric 111-2 offers the most benefit to the widest variety of applications. Overburden dielectric 121-2 may also have a lower wet etch rate compared to overburden dielectric 121-1 but the multiplicative factor may be less than the multiplicative difference between gapfill dielectric 111-2 and gapfill dielectric 111-1.

Figure 2:
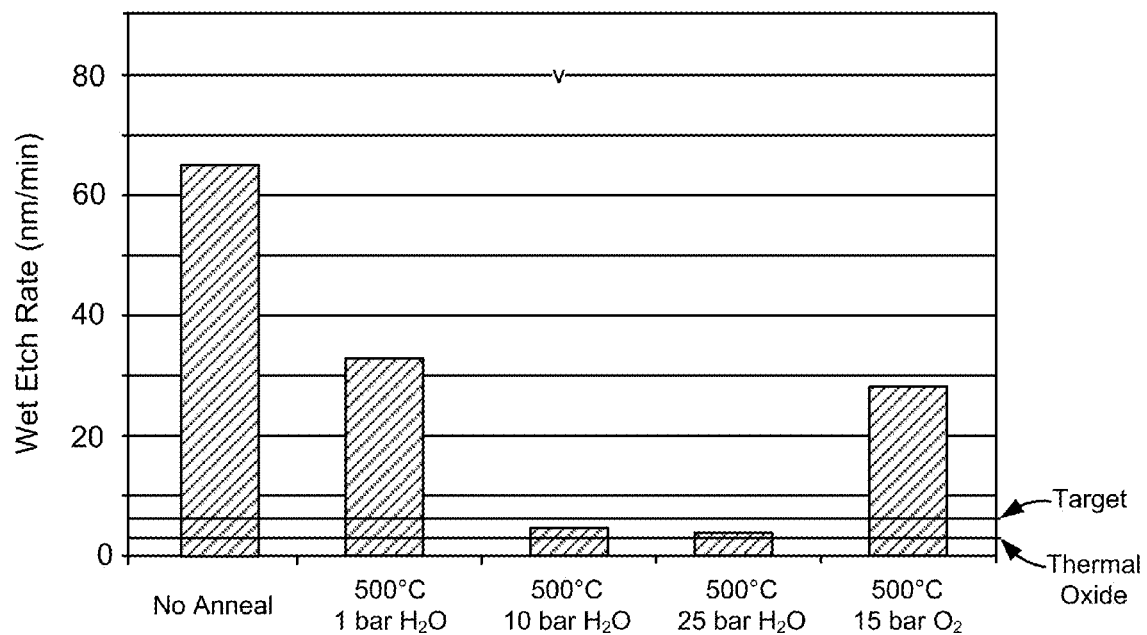
FIG. 2 is a chart of wet etch rates prior to and after various treatments according to embodiments.

FIG. 2 is a chart of wet etch rates prior to and after various treatments according to embodiments. Etch rates were measured in the trench using an aqueous, dilute (100:1) HF etching solution. All data represents wet etch rate in nanometers per minute for gapfill dielectric measured using imaging techniques to detect the removal rate of gapfill dielectric 111-2. The wet etch rate marked "no anneal" represents the etch rate of gapfill dielectric 111-2 after UV-treatment but before any other treatments are performed. The wet etch rate after only the UV-treatment is considerably higher than the "target" etch rate which is twice the "thermal oxide" wet etch rate. After an additional treatment of moisture at 1 bar (14.7 psi, Ts=500 C), the wet etch rate is halved but still above the target wet etch rate. Samples were also formed using the UV-treatment followed by a 10 bar (147 psi) and a 25 bar (368 psi) $H_2O$ treatment and both data points result in wet etch rates below the target wet etch rate. The substrate temperature was again 500° C. during both high pressure $H_2O$ treatments. Another sample was produced using a UV-treatment followed by a high pressure oxygen ($O_2$) treatment to establish whether a high pressure source of dry oxygen was sufficient. The substrate temperature was again 500° C. and the pressure of the oxygen exposure was 221 psi. The mechanism of the transformation from gapfill dielectric 121-1 to gapfill dielectric 121-2 clearly is more complex than simply a high pressure of any oxygen source.

Figure 3:
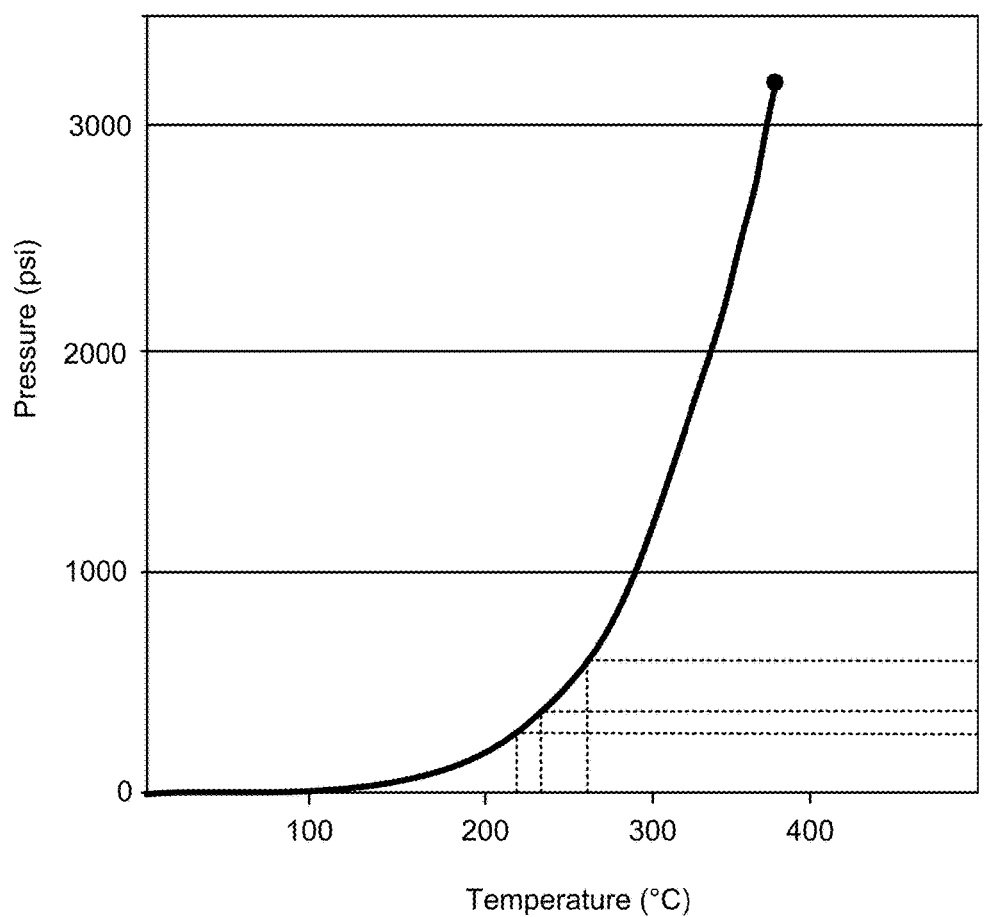
FIG. 3 is a chart of pressure vs temperature in a water phase diagram and operating temperatures and pressures according to embodiments.

FIG. 3 is a chart of pressure vs temperature in a water phase diagram and operating temperatures and pressures according to embodiments. The chart may be used to avoid condensation during the processes described herein. Condensation may form on a surface of a substrate processing region used to house the patterned substrate while exposing the patterned substrate to the high pressure of moisture ($H_2O$). Condensation is undesirable for semiconductor processes because they can cause premature degradation of hardware of the substrate processing chamber and may result in droplets of water forming or falling onto the patterned substrate. Water which evaporates from a patterned substrate can leave behind yield-reducing nonvolatile residue. Reducing or eliminating condensation within the substrate processing region is a benefit of the processes described herein.

Condensation may be avoided if no part of the chamber drops below the water condensation temperature at the pressure of the process. Conventional substrate processing chambers may be referred to as "cold-walled" chambers because the walls which form the vacuum seal are near room temperature during the treatment of the patterned substrate. The curve in FIG. 3 is the condensation curve of the phase diagram of water. The curve begins at 0° C. near 0.46 psi. The slope of the curve steadily increases so the pressure required for condensation increases rapidly as the temperature is raised towards the critical point near 374° C. and 3200 psi. The temperature of the coldest exposed internal surface of the substrate processing region is used to calculate the maximum pressure allowed before condensation may occur. The temperature is not necessarily (and will rarely be) the temperature of the patterned substrate. A few relevant examples are shown in FIG. 3 in the form of pairs of dotted lines. The highest pressure in the substrate processing region should be less than 338 psi during treatment if the coldest exposed surface within the substrate processing region is 220° C. The highest pressure in the substrate processing region should be less than 408 psi if the coldest surface exposed to the substrate processing region is 230° C. The highest pressure in the substrate processing region should be less than 683 psi if the coldest surface exposed to the substrate processing region is 260° C. These relationships may be inverted to achieve a target pressure to meet a process goal regarding densification and achievement of a desired wet etch rate. For example, the temperature of the coldest exposed surface within the substrate processing region should be maintained above 230° C. to perform the treatments described herein at 400 psi.

Generally speaking, the density of gapfill dielectric 111-2 may be increased and the wet etch rate of gapfill dielectric 111-2 may be lowered by performing the treatments described herein at higher process pressures. However, patterned substrate(s) 101 must be able to enter and exit the substrate processing region in a cost-effective manner. Off-the-shelf o-rings of a variety of operating temperatures are available which can tolerate temperatures well up into the 200° C.'s. Some desirable operating ranges may be achieved by balancing low wet etch rates with available reusable seals (O-rings). The temperature of the coldest surface exposed within the substrate processing region may be between 180° C. and 275° C., between 220° C. and 260° C., between 225° C. and 255° C. or between 230° C. and 250° C. according to embodiments during the treatments described herein. The pressure within the substrate processing region may be between 145 psi and 864 psi, between 339 psi and 684 psi, between 372 psi and 630 psi or between 408 psi and 580 psi in embodiments during the treatments. The process pressure (in psi) may be below the quantity $(14.7/760)*10^{(a-b/(T+c))}$ where a=7.96681, b=1668.21, c=228 and T is the lowest temperature of any exposed surface within the substrate processing region between 100° C. and 374° C. measured in Celsius.

The substrate may be the highest temperature point on exposed surfaces inside the substrate processing region in embodiments during the treatments described herein. The substrate temperature may be maintained at an elevated temperature to increase the densification of the gapfill dielectric. The substrate temperature during the treatment may be maintained at a low enough temperature to stay within a temperature allowed by the "thermal envelope" associated with a certain process flow and target device. Moisture ($H_2O$) has been found to facilitate operating at lower temperatures and thus stay within the thermal envelope. The substrate temperature during processing may be between 300° C. and 700° C., between 350° C. and 600° C. or between 400° C. and 550° C. in embodiments. These are high enough to allow the pores to percolate out of the film but not so high that the thermal budget is challenged for front-end of the line (FEOL) processing. The substrate processing region may be between 250° C. and 550° C., between 300° C. and 500° C. or between 350° C. and 450° C. in embodiments. The latter temperatures may be used to avoid challenging the thermal budget for back-end of the line (BEOL) processing.

Figure 4:
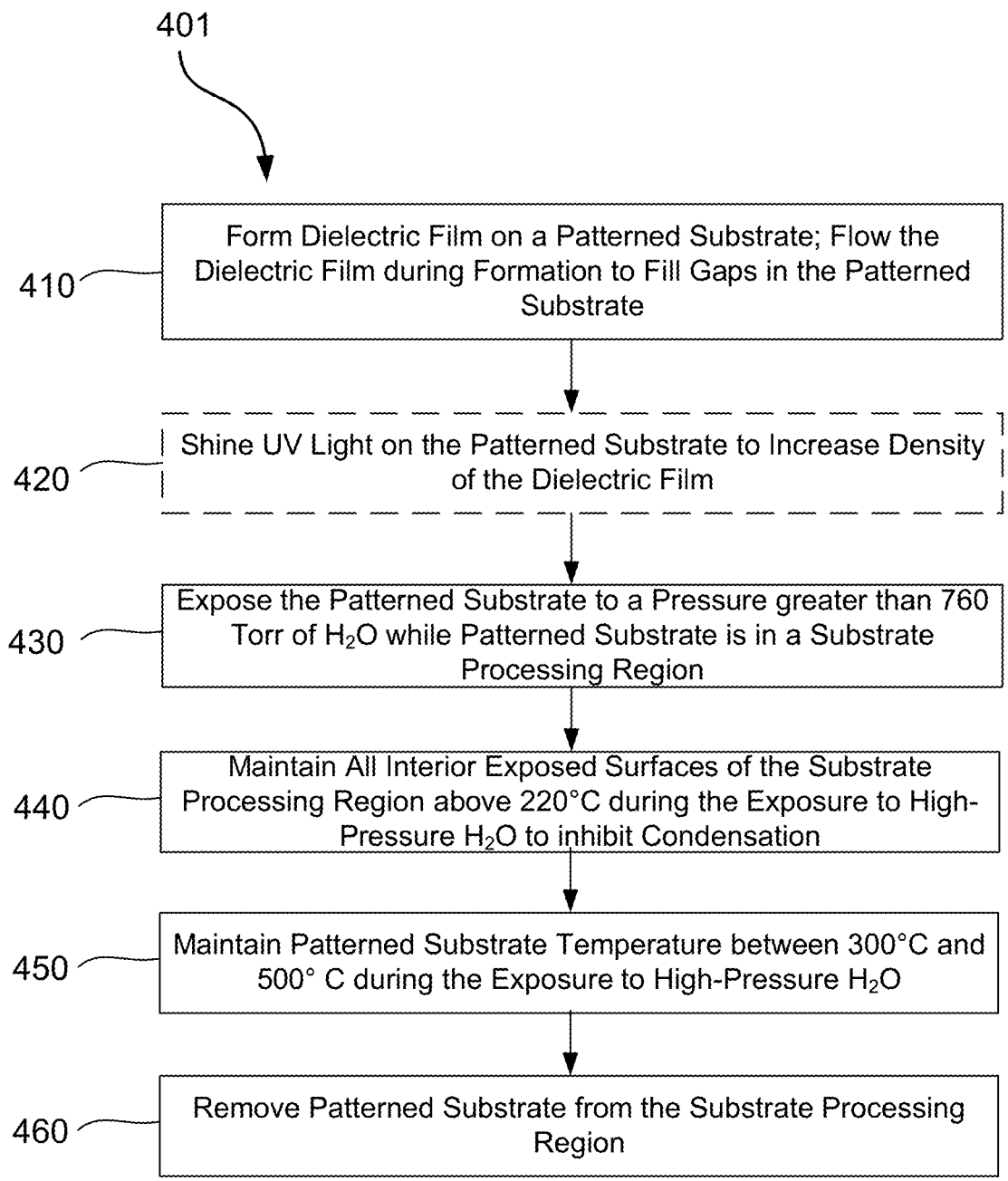
FIG. 4 is a flowchart illustrating selected steps in a method of densifying a porous film on a patterned substrate according to embodiments.

To better understand and appreciate the embodiments, reference is now made to FIG. 4 which is a flowchart illustrating selected steps in a method 401 of densifying a porous film on a patterned substrate according to embodiments. A porous silicon-and-hydrogen-containing film is initially formed on a patterned substrate in operation 410. The patterned substrate may then be placed in a substrate processing region. The patterned substrate is illuminated with ultraviolet (UV) light during optional operation 420.

Conventional treatment options like shining ultraviolet light on the patterned substrate, exposing the patterned substrate to ozone ($O_3$) and annealing the patterned substrate in steam ($H_2O$) at or less than 14.7 psi are not included in the process, according to embodiments, due to the efficacy of the high pressure treatments described herein. In some embodiments, an ozone cure or a concurrent ozone and UV cure treatment may be used before the ensuing exposure to $H_2O$ at a pressure over 14.7 psi. The patterned substrate is exposed to $H_2O$ at a process pressure greater than 14.7 psi (760 Torr) in operation 430. All exposed interior surfaces bordering the substrate processing region within the substrate processing chamber are maintained at greater than 220° C. and the pressure is kept below 338 psi in operation 440 to avoid forming condensation inside the substrate processing region. The substrate temperature is maintained between 300° C. and 500° C. during exposure to the high-pressure $H_2O$ in operation 450. The patterned substrate is removed from the substrate processing region in operation 460. Operations 430, 440 and 450 may occur concurrently according to embodiments. The substrate processing region may be devoid of plasma or plasma-free during each, any or all of operations 430, 440 and 430.

In operation 410, the porous film may be deposited by a variety of methods such as spin-on glass (SOG), spin-on dielectric (SOD) or by chemical vapor deposition (CVD). The porous film may flow after initial deposition which may help fill narrow gaps on a patterned substrate. The porous film may be referred to as a flowable porous film and may have a low dielectric constant (low-k) as measured after solidification. A low-k dielectric film may have a dielectric constant of between 2.2 and 3.0 in the trench of a completed device according to embodiments. The porous film comprises silicon and hydrogen and may be a S—C—H film, a Si—N—H film, a Si—O—H film, a Si—C—N—H film, a Si—O—C—H film or a Si—O—N—H film in embodiments. The porous film may comprise or consist of silicon, carbon and hydrogen according to embodiments. The porous film may comprise or consist of silicon, nitrogen and hydrogen according to embodiments. The porous film may comprise or consist of silicon, oxygen and hydrogen according to embodiments. The porous film may comprise or consist of silicon, carbon, nitrogen and hydrogen according to embodiments. The porous film may comprise or consist of silicon, carbon, oxygen and hydrogen according to embodiments. The porous film may comprise or consist of silicon, oxygen, nitrogen and hydrogen according to embodiments.

The substrate processing region may also be devoid of plasma or may be plasma-free during optional operation 420 in embodiments aside from the ionization resulting from the UV light. The gaps (e.g. vias and trenches) filled using the techniques described herein may have a height and width that define an aspect ratio (AR) of the height to the width (i.e., H/W) that is significantly greater than 1:1 (e.g., greater than 5:1, greater than 6:1, greater than 8:1, greater than 10:1 or greater than 12:1). In many instances the high AR is due to small gap widths below 32 nm, below 28 nm, below 22 nm or below 16 nm according to embodiments. Dense trench arrays, as defined herein, possess at least five trenches separated from neighbor(s) by less than 5 or 3 times their width in embodiments. The height may be greater than 100 nm, greater than 150 nm, greater than 250 nm or greater than 0.5 μm according to embodiments. "Top" and "Up" will be used herein to describe portions/directions perpendicularly distal from the substrate plane and further away from the center of mass of the substrate in the perpendicular direction. "Vertical" will be used to describe items aligned in the "Up" direction towards the "Top". Other similar terms (such as "height" and "width") may be used whose meanings will now be clear.

Figure 5:
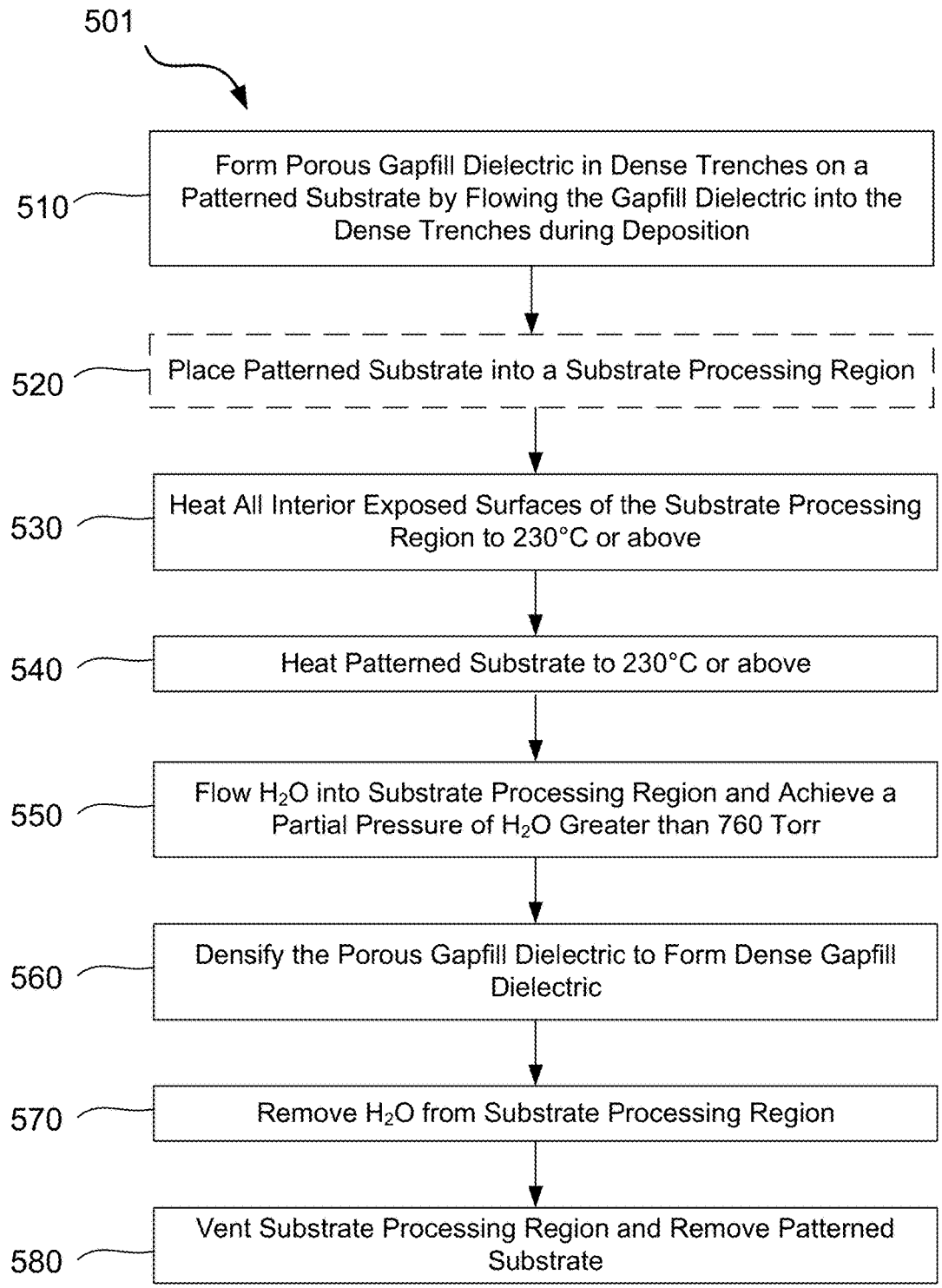
FIG. 5 is a flowchart illustrating selected steps in a method of densifying a porous film on a patterned substrate according to embodiments.

Reference will now be made to FIG. 5 which is a flowchart illustrating selected steps in a method 501 of densifying a porous film on a patterned substrate according to embodiments. A porous gapfill dielectric is formed by flowing material into dense trenches on a patterned substrate in operation 510. The patterned substrate may then optionally be transferred and placed in a substrate processing region in operation 520. In operation 530, all exposed interior surfaces of the substrate processing region are heated to 230° C. or above. The patterned substrate is heated to 230° C. or above as well in operation 540. $H_2O$ is flowed into the substrate processing region to achieve a partial pressure greater than 14.7 psi in operation 550. The porous gapfill dielectric is densified through the exposure to the high pressure of $H_2O$ in operation 560. The $H_2O$ is removed from the substrate processing region (operation 570) and the chamber may then be vented to remove the patterned substrate (operation 580). As before, the substrate processing region may be plasma-free during operations 550 and/or 560 in embodiments. According to embodiments, the substrate processing region may be plasma-free during all operations described herein.

Figure 6A:
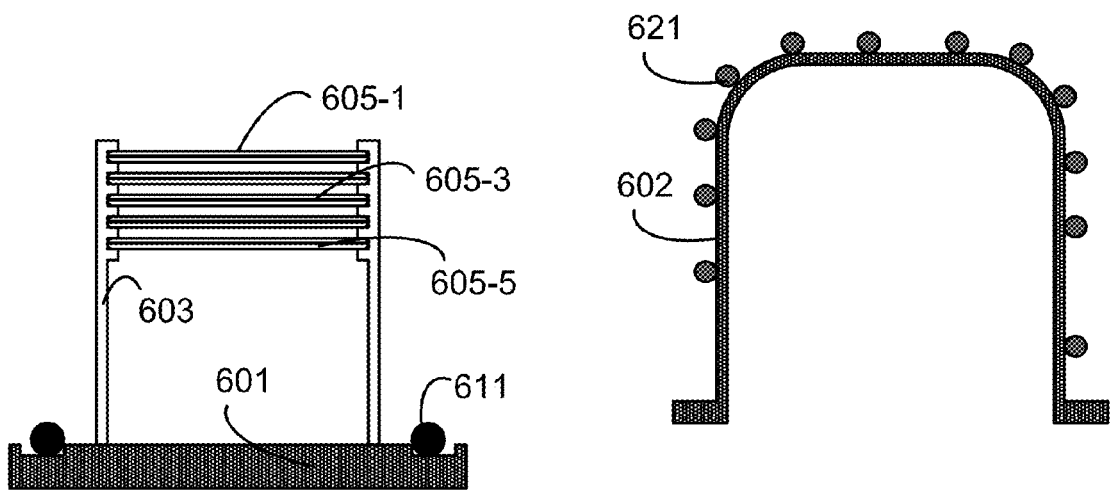
FIG. 6A shows a substrate processing chamber according to embodiments.

FIG. 6A shows a substrate processing chamber configured to expose patterned substrates (e.g. 605-1, 605-3 and 605-5) to a high partial pressure of $H_2O$ according to embodiments. The substrate processing chamber is shown prior to placing patterned substrates 605 into the substrate processing region. Patterned substrate 605 are loaded onto substrate support 603 which is affixed to chamber flange 601. An uncompressed O-ring 611 is shown in contact with an O-ring groove in chamber flange 601. The O-ring may be Kalrez™ or Viton™ to ensure high temperature compatibility. O-ring 611 may still not be able to tolerate the temperatures used for the patterned substrates 605 in embodiments. O-ring 611 and chamber flange 601 may be at a lower temperature compared to substrates 605 during substrate processing. FIG. 6A also shows chamber top 602 and heater 621 surrounding chamber top 602.

Figure 6B:
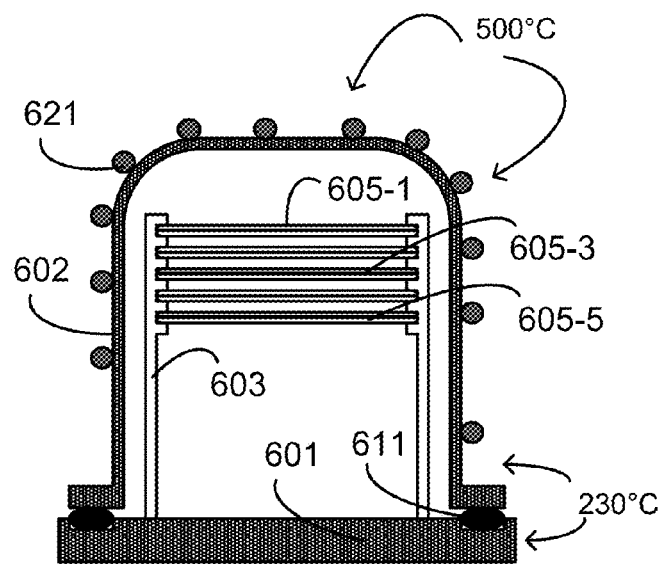
FIG. 6B shows a substrate processing chamber according to embodiments.

FIG. 6B shows a substrate processing chamber configured to expose patterned substrates 605 to a high partial pressure of $H_2O$ according to embodiments. FIG. 6B shows the substrate processing chamber assembled such that O-ring 611 is compressed to form a seal between chamber flange 601 and chamber top 602. The substrate processing region is the volume enclosed within chamber flange 601 and chamber top 602 once O-ring 611 is compressed. Patterned substrates 605 reside within the substrate processing region. Heater 621 may be a resistive heater element and may be more densely wound near the top of chamber top 602 to preferentially heat substrates 605 while allowing the bottom of chamber top 602 to remain cooler. Chamber flange 601 may be the coldest portion exposed within the substrate processing region to keep O-ring 611 within thermal operation limits given by the manufacturer. For example, The bottom portion of chamber top 602, O-ring 611 and chamber flange 601 may be the coldest exposed surfaces within the substrate processing region and may be within the temperature ranges given previously during substrate processing (e.g. at 230° C. as shown). The top portion of chamber top 602 may be near 500° C. (as shown) to maintain a higher temperature for patterned substrates 605 during processing. Lower temperatures may be used for back-end of the line (BEOL) substrate processing. Processing temperature ranges for patterned substrates were given previously and will not be repeated here for the sake of brevity.

For all examples described herein, the patterned substrate may not be exposed to external atmosphere (atmosphere from the cleanroom outside a semiconductor processing mainframe or chamber) from the operation of forming the porous film on the patterned substrate to the operations of exposing the patterned substrate to the hydrogen-containing precursor and illuminating the patterned substrate with UV light or exposing the patterned substrate to ozone prior to densification using the methods described herein.

Any or all of the deposition methods described herein may have a low electron temperature in the substrate processing region during the deposition to ensure the beneficial chemical reactions deep within the porous film according to embodiments. The electron temperature may be measured using a Langmuir probe in the substrate processing region. In embodiments, the electron temperature may be less than 0.5 eV, less than 0.45 eV, less than 0.4 eV, or less than 0.35 eV. Introducing alternative nomenclature, the substrate processing region may be described herein as "plasma-free" during the deposition processes described herein. "Plasma-free" does not necessarily mean the region is devoid of plasma. Ionized species and free electrons created within the plasma region may travel through pores (apertures) in the partition (showerhead) at exceedingly small concentrations. The borders of the plasma in the chamber plasma region are hard to define and may encroach upon the substrate processing region through the apertures in the showerhead. Furthermore, a low intensity plasma may be created in the substrate processing region without eliminating desirable features of the deposition processes described herein. All causes for a plasma having much lower intensity ion density than the chamber plasma region during the creation of the excited plasma effluents do not deviate from the scope of "plasma-free" as used herein.

Figure 7A:
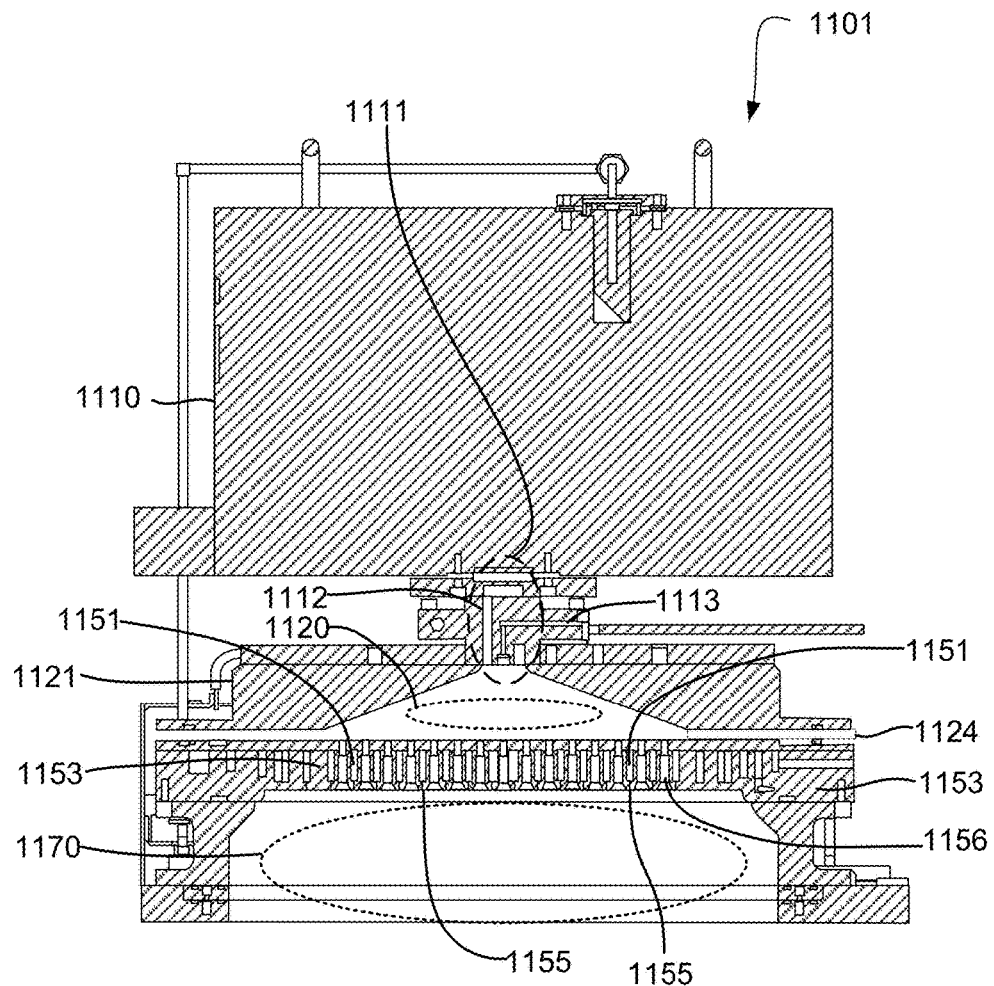
FIG. 7A shows a substrate processing chamber according to embodiments.

FIG. 7A is a substrate processing chamber 1101 according to embodiments. A remote plasma system (RPS) 1110 may process a gas which then travels through a gas inlet assembly 1111. Two distinct gas supply channels are visible within the gas inlet assembly 1111. A first channel 1112 carries a gas that passes through the remote plasma system (RPS) 1110, while a second channel 1113 bypasses the RPS 1110. The first channel 1112 may be used for the process gas and the second channel 1113 may be used for a treatment gas in embodiments. The lid (or conductive top portion) 1121 and a perforated partition 1153 are shown with an insulating ring 1124 in between, which allows an AC potential to be applied to the lid 1121 relative to perforated partition 1153. The process gas travels through first channel 1112 into chamber plasma region 1120 and may be excited by a plasma in chamber plasma region 1120 alone or in combination with RPS 1110. The combination of chamber plasma region 1120 and/or RPS 1110 may be referred to as a remote plasma system herein. The perforated partition (also referred to as a showerhead) 1153 separates chamber plasma region 1120 from a substrate processing region 1170 beneath showerhead 1153. Showerhead 1153 allows a plasma present in chamber plasma region 1120 to avoid directly exciting gases in substrate processing region 1170, while still allowing excited species (plasma effluents) to travel from chamber plasma region 1120 into substrate processing region 1170.

Showerhead 1153 is positioned between chamber plasma region 1120 and substrate processing region 1170 and allows plasma effluents (excited derivatives of precursors or other gases) created within chamber plasma region 1120 to pass through a plurality of through holes 1156 that traverse the thickness of the plate. The showerhead 1153 also has one or more hollow volumes 1151 which can be filled with a precursor (e.g. TSA) in the form of a vapor or gas (such as a silicon-and-carbon-containing precursor) and pass through small holes 1155 into substrate processing region 1170 but not directly into chamber plasma region 1120.

In the embodiment shown, showerhead 1153 may distribute (via through holes 1156) process gases which contain plasma effluents of process gases upon excitation by a plasma in chamber plasma region 1120. A nitrogen-containing precursor (e.g. $NH_3$) may be flowed through RPS 1110 to form a Si—N—H film when the plasma effluents created encounter TSA. The precursors may be selected to form the various films treated herein by chemical vapor deposition. Other techniques may be used to form porous films without using chemical vapor deposition (e.g. SOD or SOG). The process gas may also include a carrier gas such as helium, argon, nitrogen ($N_2$), etc. The second channel 1113 may also deliver a process gas and/or a carrier gas, and/or a film-treatment or curing gas used to remove an unwanted component from the growing or as-deposited film. Plasma effluents may include ionized or neutral derivatives of the process gas and may also be referred to herein as a radical-oxygen precursor referring to the atomic constituent of the process gas introduced.

Figure 7B:
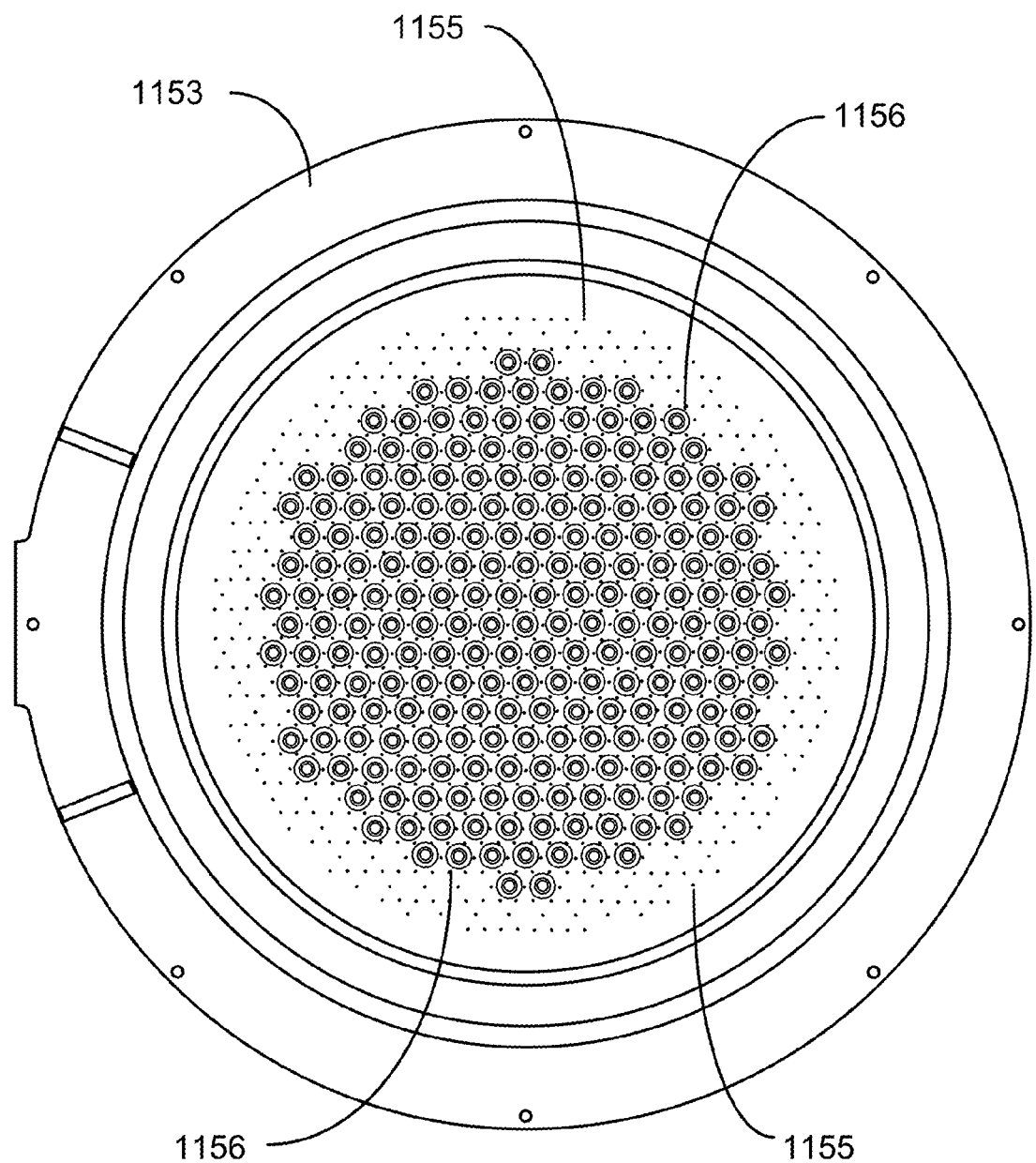
FIG. 7B shows a gas distribution showerhead according to embodiments.

FIG. 7B is a bottom view of a showerhead 1153 for use with a processing chamber according to embodiments. Showerhead 1153 corresponds with the showerhead shown in FIG. 7A. Through-holes 1156 are depicted with a larger inner-diameter (ID) on the bottom of showerhead 1153 and a smaller ID at the top. Small holes 1155 are distributed substantially evenly over the surface of the showerhead, even amongst the through-holes 1156 which helps to provide more even mixing.

An exemplary film is created on a substrate supported by a pedestal (not shown) within substrate processing region 1170 when plasma effluents arriving through through-holes 1156 in showerhead 1153 combine with a silicon-and-carbon-containing precursor arriving through the small holes 1155 originating from hollow volumes 1151. Though substrate processing region 1170 may be equipped to support a plasma for other processes such as curing, no plasma is present during the growth of the exemplary film. The pedestal may be configured to cool or heat a supported substrate to maintain relatively low temperatures (from room temperature through about 120° C.).

A plasma may be ignited either in chamber plasma region 1120 above showerhead 1153 or substrate processing region 1170 below showerhead 1153. A plasma is present in chamber plasma region 1120 to produce the radical precursor from an inflow of an unexcited precursor. An AC voltage typically in the radio frequency (RF) range is applied between the conductive top portion 1121 of the processing chamber and showerhead 1153 to ignite a plasma in chamber plasma region 1120 during deposition. An RF power supply generates a high RF frequency of 13.56 MHz but may also generate other frequencies alone or in combination with the 13.56 MHz frequency. Exemplary RF frequencies include microwave frequencies such as 2.4 GHz. The remote plasma power may be greater than or about 1000 watts, greater than or about 2000 watts, greater than or about 3000 watts or greater than or about 4000 watts in embodiments, during deposition of the flowable film. The substrate processing system is controlled by a system controller. A process for depositing a film stack on a substrate can be implemented using a computer program product that is executed by the system controller.

Figure 8:
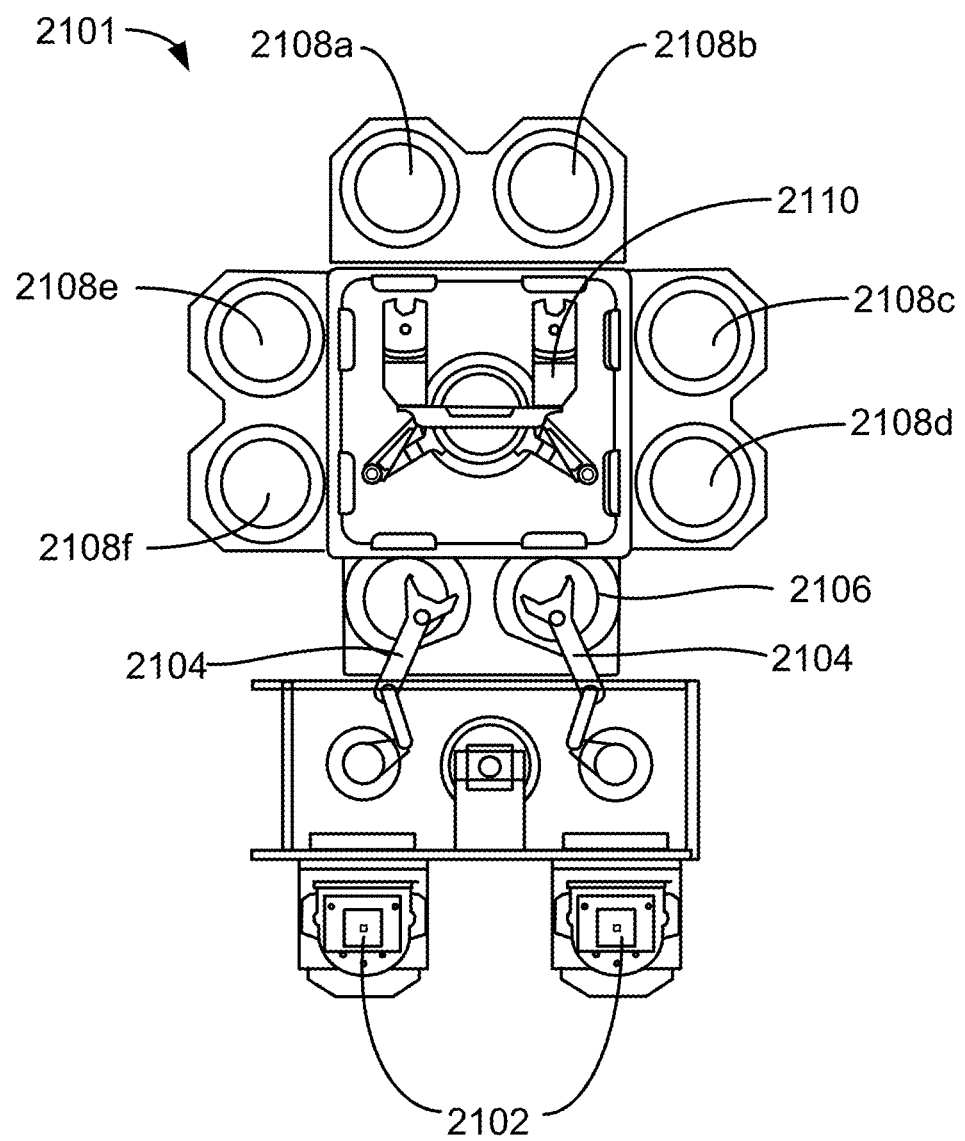
FIG. 8 shows a substrate processing system according to embodiments.

FIG. 8 shows an exemplary processing system 2101 for deposition and densifying films according to embodiments. FOUPs (front opening unified pods) 2102 supply substrates by way of robotic arms 2104 into low pressure holding areas 2106. A second robotic arm 2110 may be used to transport the substrate wafers from holding areas 2106 to substrate processing chambers 2108a-f and back.

Substrate processing chambers 2108a-f may be configured to deposit or perform a variety of treatments on the deposited layer(s). In one configuration, two pairs of the processing chamber (e.g., 2108c-d and 2108e-f) may be used to deposit the flowable dielectric material on the substrate, and the third pair of processing chambers (e.g., 2108a-b) may be used to cure the dielectric material using ultraviolet or e-beam illumination.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. The term "precursor" is used to refer to any process gas or liquid which takes part in a reaction to either remove material from or deposit material onto a surface. A precursor may be delivered from as a liquid precursor or a gas-phase precursor. A gas in an "excited state" describes a gas wherein at least some of the gas molecules are in vibrationally-excited, dissociated and/or ionized states. A gas (or precursor) may be a combination of two or more gases (or precursors). A "radical precursor" is used to describe plasma effluents (a gas in an excited state which is exiting a plasma) which participate in a reaction to either remove material from or deposit material on a surface. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The term "gap" is used throughout with no implication that the etched geometry has a large horizontal aspect ratio. Viewed from above the surface, gaps may appear circular, oval, polygonal, rectangular, or a variety of other shapes. A "trench" is a long gap (e.g. with a length to width ratio of greater than 5 or greater than 10). A trench may be in the shape of a moat around an island of material whose aspect ratio is the length or circumference of the moat divided by the width of the moat. The term "via" is used to refer to a low aspect ratio gap (as viewed from above) which may or may not be filled with metal to form a vertical electrical connection.

Having described several embodiments, it will be recognized by those of skill in the art that various modifications, alternative constructions, and equivalents may be used without departing from the spirit of the embodiments. Additionally, a number of well-known processes and elements have not been described to avoid unnecessarily obscuring the embodiments. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the disclosed embodiments, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of processing a gapfill dielectric on a patterned substrate, the method comprising:
    forming a gapfill dielectric in a gap on the patterned substrate, wherein the gapfill dielectric comprises pores but otherwise fills the gap on the patterned substrate and wherein a width of the gap is below 32 nm and a height of the gap is greater than 100 nm;
    placing the patterned substrate into a substrate processing region of a substrate processing chamber, and
    densifying the gapfill dielectric by exposing the gapfill dielectric to gas-phase $H_2O$ at a partial pressure between 145 psi and 864 psi to form densified gapfill dielectric, wherein the gapfill dielectric comprises silicon and hydrogen and wherein a temperature of the patterned substrate is between 300° C. and 700° C. during the densifying of the gapfill dielectric.

2. The method of claim 1 further comprising exposing the gapfill dielectric to UV-light prior to densifying the gapfill dielectric.

3. The method of claim 1 further comprising etching the gapfill dielectric with HF or a buffered oxide etching solution.

4. The method of claim 1 wherein a lowest temperature of an exposed surface within the substrate processing region is greater than 180° C.

5. The method of claim 1 further comprising removing the patterned substrate from the substrate processing region after densifying the gapfill dielectric.

6. The method of claim 1 wherein forming the gapfill dielectric comprises flowing material into the gap after the gapfill dielectric is initial deposited elsewhere on the patterned substrate.

7. The method of claim 1 wherein forming the gapfill dielectric comprises flowing material onto the patterned substrate from a liquid phase precursor.

8. The method of claim 1 wherein forming the gapfill dielectric comprises flowing material onto the patterned substrate from gas-phase precursors.

9. The method of claim 1 wherein the gapfill dielectric contains no elements other than silicon, carbon, nitrogen, hydrogen and oxygen after forming the gapfill dielectric.

10. The method of claim 1 wherein a dielectric constant of the gapfill dielectric is between 2.2 and 3.0.

11. The method of claim 1 wherein a process pressure (in psi) is below $(14.7/760)*10^{(a-b/(T+c))}$ where a=7.96681, b=1668.21, c=228 and T is the lowest temperature of any exposed surface within the substrate processing region, and wherein T is between 100° C. and 374° C.

12. A method of filling a trench in a patterned substrate, the method comprising:
    forming a dielectric film on the patterned substrate, wherein forming the dielectric film comprises flowing dielectric material into the trench after initial deposition elsewhere onto the patterned substrate, wherein the dielectric material in the trench comprises pores but otherwise fills the trench on the patterned substrate and wherein the dielectric material comprises silicon and hydrogen, wherein an aspect ratio of the height to the width of the trench is greater than 5:1; and
    placing the patterned substrate into a substrate processing region of a substrate processing chamber, and
    densifying the dielectric material in the trench by exposing the dielectric material to gas-phase $H_2O$ at a partial pressure of $H_2O$ within the substrate processing region to form densified gapfill dielectric, wherein the partial pressure of $H_2O$ within the substrate processing region is between 145 psi and 864 psi, and wherein a temperature of the patterned substrate is between 300° C. and 700° C. during the densifying of the dielectric material.

13. The method of claim 12 wherein a temperature of a coldest surface exposed within the substrate processing region is between 180° C. and 275° C.

14. The method of claim 12 wherein a process pressure (in psi) is below $(14.7/760)*10^{(a-b/(T+c))}$ where a=7.96681, b=1668.21, c=228 and T is the lowest temperature of any exposed surface within the substrate processing region, and wherein T is between 100° C. and 374° C.

15. The method of claim 12 wherein no condensation is formed within the substrate processing region while densifying the dielectric material.

16. The method of claim 12 wherein no liquid $H_2O$ is formed in the substrate processing chamber while exposing the dielectric material to gas-phase $H_2O$.

17. The method of claim 12 wherein the trench is part of a dense trench array.

* * * * *